Figure 1:
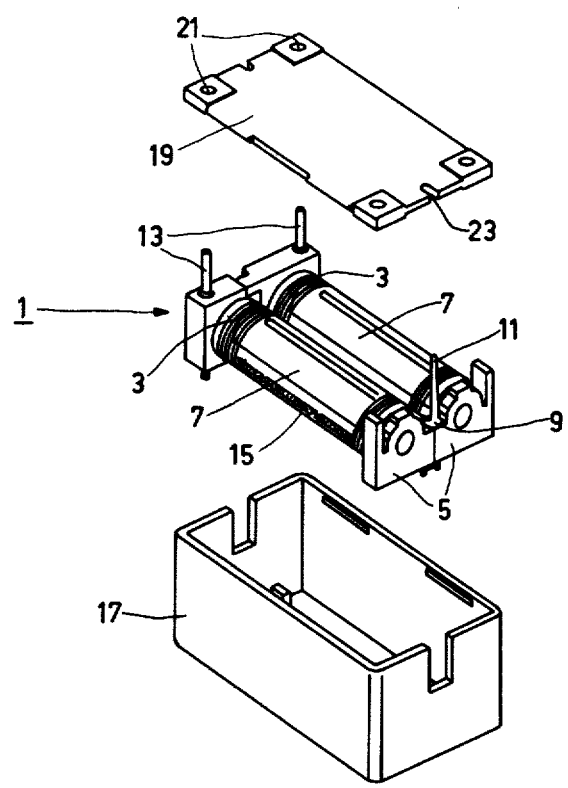

United States Patent [19]

van der Linden et al.

[11] 4,310,815

[45] Jan. 12, 1982

[54] ELECTROMAGNETIC DELAY LINE

[75] Inventors: Peter M. C. van der Linden; Cornelis van Wieringen, both of Eindhoven, Netherlands

[73] Assignee: U.S. Philips Corporation, New York, N.Y.

[21] Appl. No.: 163,768

[22] Filed: Jun. 27, 1980

[30] Foreign Application Priority Data

Jul. 6, 1979 [NL] Netherlands .......................... 7905281

[51] Int. Cl.³ .............................................. H03H 7/34
[52] U.S. Cl. ..................................... 333/138; 333/140; 333/156
[58] Field of Search .................................. 333/138–140, 333/156, 162, 23, 184, 185; 336/69, 184, 220; 29/592, 600, 601, 602 R

[56] References Cited

U.S. PATENT DOCUMENTS

| | | | |
|---|---|---|---|
| 3,177,451 | 4/1965 | Swanson | 333/162 |
| 3,202,906 | 8/1965 | Maeda | 336/69 X |
| 4,160,962 | 7/1979 | De Keyser | 333/156 X |

*Primary Examiner*—Marvin L. Nussbaum
*Attorney, Agent, or Firm*—William J. Streeter; Bernard Franzblau

[57] ABSTRACT

An electromagnetic delay line, comprising two coil formers (5) which are provided with windings and which are adjacently arranged in parallel. On the outer surface of each coil former (5) there is provided a metal strip (7). The metal strips (7) are interconnected by way of a narrow connecting strip (9). During the deposition of windings (3), the coil formers (5) are situated one in the prolongation of the other. Subsequently, they are pivoted to their ultimate position via the connecting strip.

4 Claims, 4 Drawing Figures

ELECTROMAGNETIC DELAY LINE

The invention relates to an electromagnetic delay line, comprising two cylindrical coil formers on the outer surfaces of which there are provided metal strips which extend parallel to their axes, said coil formers each supporting a winding which is insulated with respect to the metal strip and being adjacently arranged so that their axes extend in parallel.

A delay line of this kind is known from "Radio Mentor", 1964, No. 2, pages 111–114. The invention has for its object to improve this delay line so that it can be very simply and hence inexpensively manufactured.

To this end, the delay line in accordance with the invention is characterized in that the two coil formers are pivotably interconnected near one end by means of a narrow connecting strip which is integral with the metal strips.

Thanks to this step, the two coil formers may be situated in line during the deposition of the windings, so that both windings can be provided in one operation, after which the coil formers can be positioned alongside one another by way of a pivoting movement.

In a preferred embodiment of the delay line in accordance with the invention, further manufacturing costs are saved in that the outer surface of each coil former is provided with two grooves which extend parallel to its axis, the edges of the metal strips being pressed into said grooves for the purpose of attachment, the connecting strip extending from a groove in the one coil former to the corresponding groove in the other coil former.

In this construction it is not necessary to secure the metal strips by means of a separate operation, such as gluing, and loosening of the strips due to the forces occurring during pivoting is prevented.

The invention will be described in detail hereinafter with reference to the accompanying diagrammatic drawings.

Figure 2:
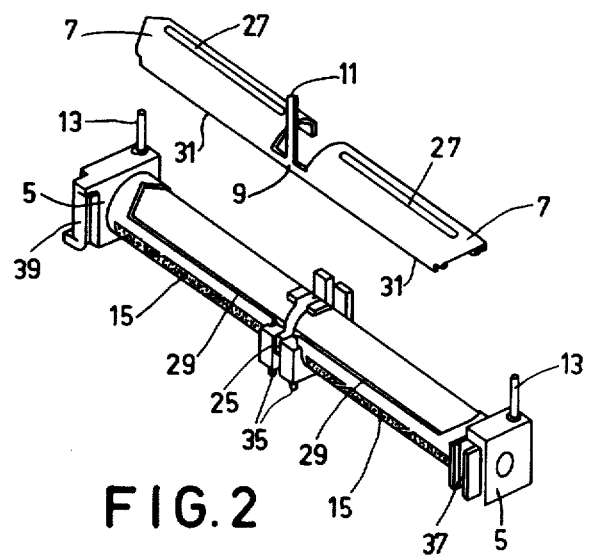
Figure 3:
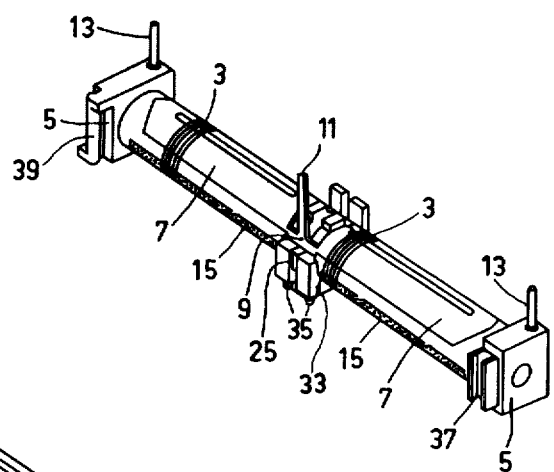
Figure 4:
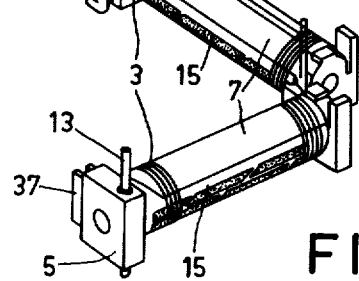

In the drawings:

FIG. 1 is a perspective exploded view of an embodiment of the delay line in accordance with the invention, FIG. 2 is a perspective view of two parts of the delay line shown in FIG. 1, FIG. 3 is a perspective view of the parts shown in FIG. 2 after assembly and deposition of the windings, and FIG. 4 is a perspective view of a further manufacturing step.

The electromagnetic delay line shown in FIG. 1 comprises a coil assembly 1 which consists of two coil formers 5 which are provided with windings 3. The windings 3 are only partly shown for visibility of the parts situated underneath these windings. Actually, these windings extend continuously over substantially the entire length of the coil formers 5.

Underneath each winding 3, and insulated therefrom, a strip 7 is provided on the outer surface of each coil former 5, said strip extending parallel to the axis of the coil former and forming a distributed capacitance in conjunction with the winding 3. The two coil formers 5 are pivotably interconnected near one end (the right hand end in FIG. 1), by way of a connecting strip 9 which is integral with the metal strip 7 and whose width is substantially less than that of the metal strips. The connecting strip 9 comprises a connection pin 11 for the grounding of the metal strips 7. Two connection pins 13 to which the windings 3 are connected are embedded in the synthetic material of the coil formers 5.

On the outer surface of the coil formers 5 there are also provided interrupted conductor strips 15 for the compensation of differences in delay time. These strips can be provided by means of any suitable technique; for example, see German Auslegeschrift 1,541,985.

The coil assembly 1 is accommodated in a housing 17 of a synthetic material which is subsequently closed by means of a cover plate 19 of a synthetic material which is provided with apertures 21 for the connection pins 13 and a recess 23 for the connection pin 11.

The FIGS. 2, 3 and 4 show three stages in the manufacture of the coil assembly 1. Corresponding parts are denoted by the same reference numerals as used in FIG. 1.

FIG. 2 shows the two coil formers 5 which are situated on a common axis and which are interconnected via bridges 25, only one of which is visible. The two coil formers 5 and the bridges 25 are made of a synthetic material as one unit. The two metal strips 7 with the connecting strip 9 and the connection pin 11 are also made as one unit from a sheet of metal, for example, brass, by a punching and bending operation. At the same time, in each metal strip 7 a slit 27 is formed which extends in the longitudinal direction of the strip. The width of this slit determines the surface are of the metal strip 7 and hence the value of the capacitance between this metal strip and the winding 3 to be provided at a later stage. Thus, this capacitance can be readily varied by exchanging the part of the punching tool which determines the width of the slit 27. The external dimensions of the strip 7 and the thickness and composition of a dielectric layer provided thereon or on the winding wire, consequently, need not be changed, so that costs are saved.

The outer surface of each of the coil formers 5 is provided with two grooves 29 which extend parallel to its axis, only one groove being visible in FIG. 2. The edges 31 of the metal strips 7 can be pressed into these grooves, so that the metal strips are firmly secured to the coil formers 5 without additional operations such as gluing being required.

After the edges 31 have been pressed into the grooves 29, the connecting strip 9 extends from a groove in the one coil former 5 to the corresponding groove in the other coil former. This position of the connecting strip 9 implies that the forces occurring during the later pivoting movement, when the connecting strip acts as a pivot, are directed so that they cannot lift the metal strips 7 out of the grooves 29.

As is shown in FIG. 3, after the mounting of the metal strips 7, the windings 3 are provided; during this operation, the coil formers 5 are still situated in line. As a result, the deposition of the two windings is substantially equally simple as the deposition of a single windings. The winding wire 33 need not be interrupted between the two coil formers. After the completion of the first winding 3, the wire is merely wrapped a few times around a pin 35 formed on the first coil former 5, after which it is guided to a corresponding pin 35 on the second coil former 5, around which it is also wrapped a few times; subsequently, the second winding 3 can be provided.

After the deposition of the windings 3, the bridges 25 are removed, so that the two coil formers remain interconnected only by way of the connecting strip 9 (and the wire 33). By pivoting the coil formers around this connecting strip as shown in FIG. 4, ultimately the coil assembly 1 shown in FIG. 1 is obtained. In order to realize a rugged assembly, the ends of the coil formers 5 which are not interconnected via the connecting strip 9 are interconnected after the pivoting movement. This can be realized, if desired, by means of the drop of glue, but in the preferred embodiment described herein use is made of a snap connection. To this end, the first coil former 5 is provided with a slightly resilient clamp 37 which can accommodate a protrusion 39 formed on the second coil former 5. The protrusion 39 must be pressed into the clamp 37 with some force, and can also be removed only by force.

What is claimed is:

1. An electromagnetic delay line, comprising two cylindrical coil formers on the outer surfaces of which there are provided metal strips which extend parallel to their axes, said coil formers each supporting a winding which is insulated with respect to the metal strip and being adjacently arranged so that their axes extend in parallel, characterized in that the two coil formers (5) are pivotably interconnected near one end by means of a narrow connecting strip (9) which is integral with the metal strips (7).

2. A delay line as claimed in claim 1, characterized in that in the outer surface of each coil former (5) there are provided two grooves (29) which extend parallel to the coil former axis and in which the edges (31) of the metal strips (7) are pressed in order to secure the strips, the connecting strip (9) extending from a groove (29) in the coil former (5) to the corresponding groove (29) in the other coil former (5).

3. A delay line as claimed in claim 2, characterized in that the metal strips (7) are provided with a slit (27) which extends in their longitudinal direction.

4. A delay line as claimed in any of the preceding claims, characterized in that the ends of the two coil formers (5) which are not interconnected by way of the connecting strip (9) are interconnected by means of a snap connection (37, 39).

* * * * *